United States Patent
Wang et al.

(10) Patent No.: US 7,422,817 B2
(45) Date of Patent: Sep. 9, 2008

(54) FUEL CELL DEVICE WITH COMPOUND POWER SUPPLY

(75) Inventors: Chien-Lang Wang, Taipei (TW); Feng-Yi Deng, Taipei (TW); Tsang-Ming Chang, Taipei (TW); Hsi-Ming Shu, Taipei (TW); Wei-Li Huang, Taipei (TW)

(73) Assignee: Antig Technology Co., Ltd., Taipei (TW)

( * ) Notice: Subject to any disclaimer, the term of this patent is extended or adjusted under 35 U.S.C. 154(b) by 308 days.

(21) Appl. No.: 11/326,366

(22) Filed: Jan. 6, 2006

(65) Prior Publication Data

US 2006/0154118 A1 Jul. 13, 2006

(30) Foreign Application Priority Data

Jan. 7, 2005 (TW) .............................. 94200371 U

(51) Int. Cl.
*H01M 2/00* (2006.01)
*H01M 8/00* (2006.01)
*H01M 12/00* (2006.01)
*H01M 10/44* (2006.01)

(52) U.S. Cl. ............................... 429/34; 429/9; 429/12; 320/101; 320/138

(58) Field of Classification Search ..................... 429/9, 429/12, 17, 20, 22, 26, 30, 34; 320/101, 320/138
See application file for complete search history.

(56) References Cited

U.S. PATENT DOCUMENTS

| | | | |
|---|---|---|---|
| 6,194,092 B1 * | 2/2001 | Ohara et al. | .................... 429/9 |
| 2002/0076588 A1 * | 6/2002 | Singh et al. | .................... 429/20 |
| 2004/0164702 A1 * | 8/2004 | Holmes | ....................... 320/101 |

\* cited by examiner

*Primary Examiner*—Alexa D. Neckel
*Assistant Examiner*—Claire L Rademaker

(57) ABSTRACT

A fuel cell device with a compound power supply is disclosed, which comprises a bipolar fuel cell board and an auxiliary power supply. The bipolar fuel cell board includes at least one fuel cell unit. The auxiliary power supply is disposed on the bipolar fuel cell board and/or on an intermediate substrate sandwiched within the fuel cell device, and is connected to the fuel cell units. Stable power is output due to the combination of power from the fuel cell units and the auxiliary power supply.

5 Claims, 4 Drawing Sheets

FUEL CELL DEVICE WITH COMPOUND POWER SUPPLY

FIELD OF THE INVENTION

The present invention relates to a fuel cell device, and more particularly, to a fuel cell employing an auxiliary power supply, so as to constitute a fuel cell device with compound supplying power.

BACKGROUND OF THE INVENTION

A conventional fuel cell, such as a methanol fuel cell, utilizes hydrogen-containing fuels like methanol to generate power during an electrochemical reaction. At the beginning, this fuel cell reacts slowly due to the low temperature of the fuels, the outputs became gradually immense and thereafter stable power generated. Hence, the initial power of the cell is insufficient for an electronic equipment. The output power is also affected by operational factors of the cell, for example, temperature, concentration, pressure, and flow rates. The electronic equipment may malfunction under the worst operational condition.

Therefore, a fuel cell device with a compound power supply is disclosed to overcome the aforesaid disadvantages and to provide stably quality power.

SUMMARY OF THE INVENTION

It is a primary object of the invention to provide a fuel cell device that integrates an assistant compound power supply.

It is a secondary object of the invention to provide a fuel cell device with a compound power supply. The power generated by the fuel cell units is supplemented with the power generated by the assistant power supply, and hence stable power is output.

In accordance with the objects of the invention, a fuel cell device having a compound power supply is provided. The device comprises a bipolar fuel cell board and an auxiliary power supply. The bipolar fuel cell board includes at least one fuel cell unit. The auxiliary power supply is disposed on the bipolar fuel cell board and/or on an intermediate substrate sandwiched within the fuel cell device, and is connected to the fuel cell units. Stable power is output due to the integration of power from the fuel cell units and the auxiliary power supply.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE INVENTION

In accordance with one embodiment of the invention, the fuel cell device 1 with a power supply integrates the power generated by fuel cell units and the power provided by other suppliers, so as to supplement power produced in an initial period when the fuel cell units start.

Figure 1:
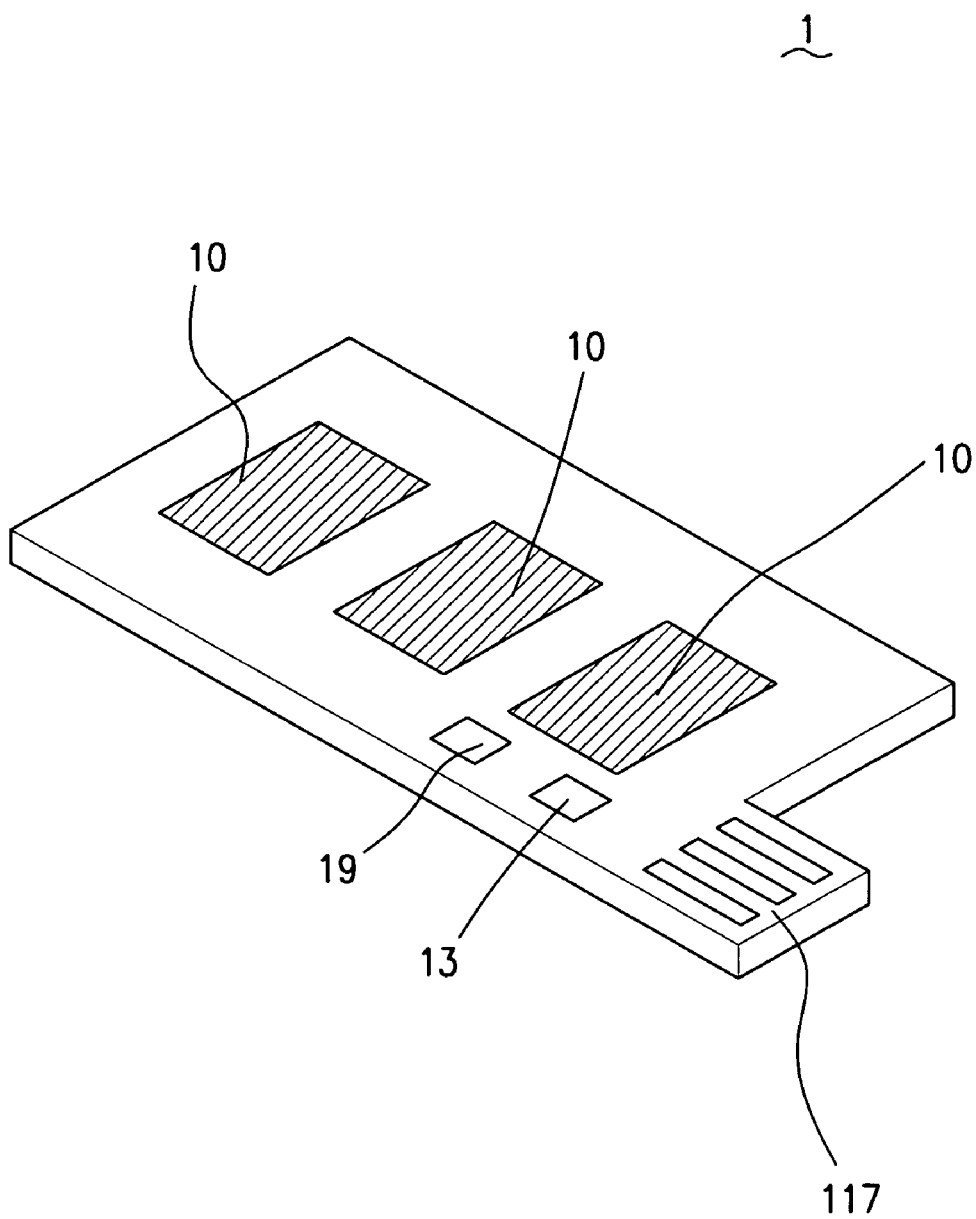
FIG. 1 illustrates the structure of a fuel cell device with a compound power supply according to one embodiment of the invention.
Figure 2:
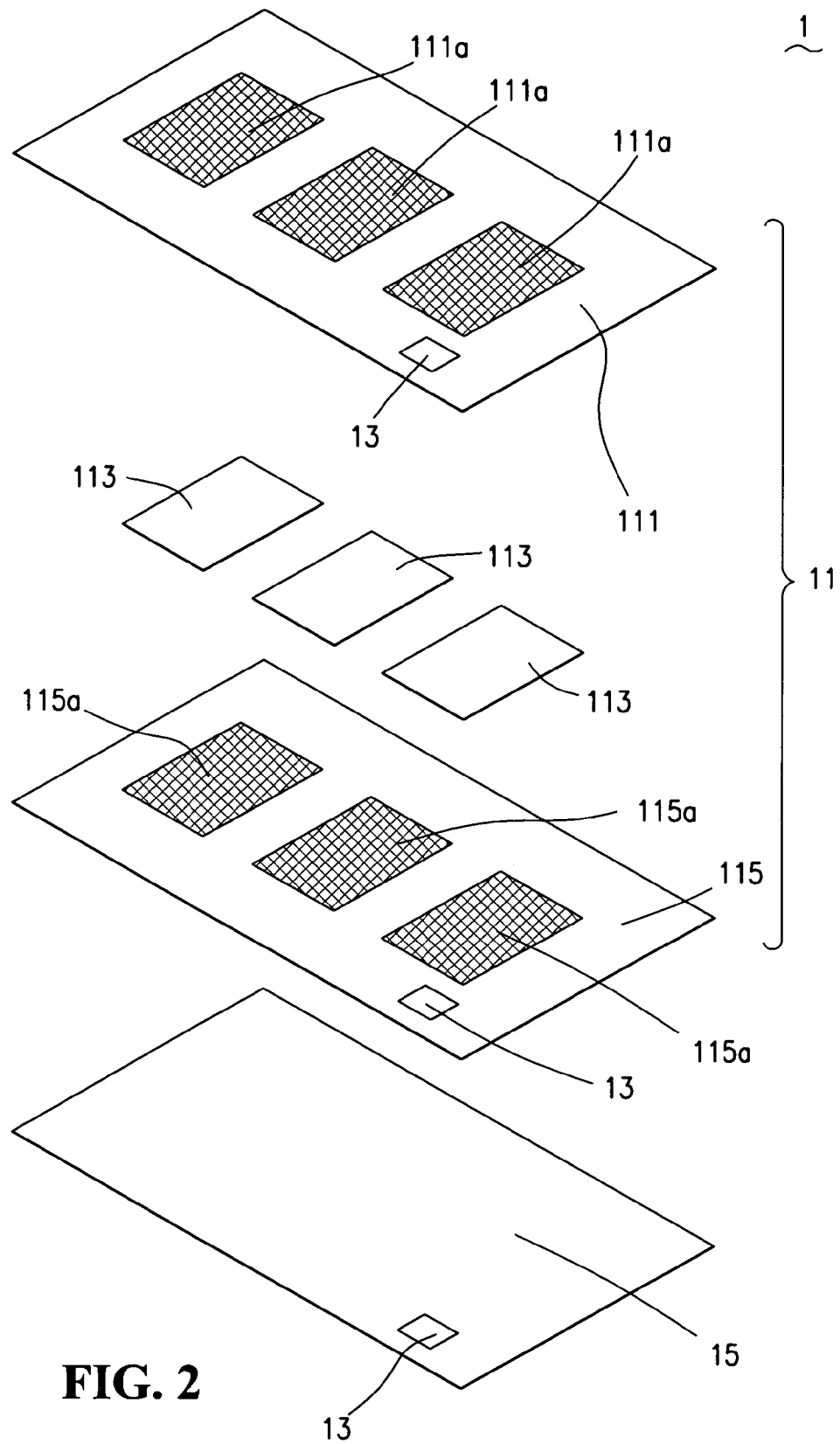
FIG. 2 is an exploded diagram showing a fuel cell device with a compound power supply according to one embodiment of the invention.

FIG. 1 illustrates the structure of a fuel cell device with a compound power supply according to one embodiment of the invention. FIG. 2 is an exploded diagram showing a fuel cell device with a compound power supply according to one embodiment of the invention. The fuel cell device 1 with a compound power supply comprises a bipolar fuel cell board 11 and an auxiliary power supply 13. The bipolar fuel cell board 11 includes a cathode current collector 111, an anode current collector 115 and at least one membrane electrode assembly (MEA) 113. A plurality of cathode current collecting circuitries 111a are disposed on the cathode current collector 111 corresponding to the MEAs 113. A plurality of anode current collection circuitries 115a are disposed on the anode current collector 115 corresponding to the MEAs 113. Each MEA 113 is sandwiched in between a cathode current collecting circuitry 111a and an anode current collecting circuitry 115a, all of which constitute a fuel cell unit 10.

Referring to FIG. 2, the auxiliary power supply 13 may be positioned on the cathode current collector 111. For example, the auxiliary power supply 13 is soldered on the top surface or the bottom surface of the cathode current collector 111. Alternatively, the auxiliary power supply 13 may be disposed on the anode current collector 115. For example, the auxiliary power supply 13 is soldered on the top surface or the bottom surface of the anode current collector 115.

In another embodiment, the auxiliary power supply 13 may be disposed on a flow plate 15 as shown in FIG. 2.

Figure 3:
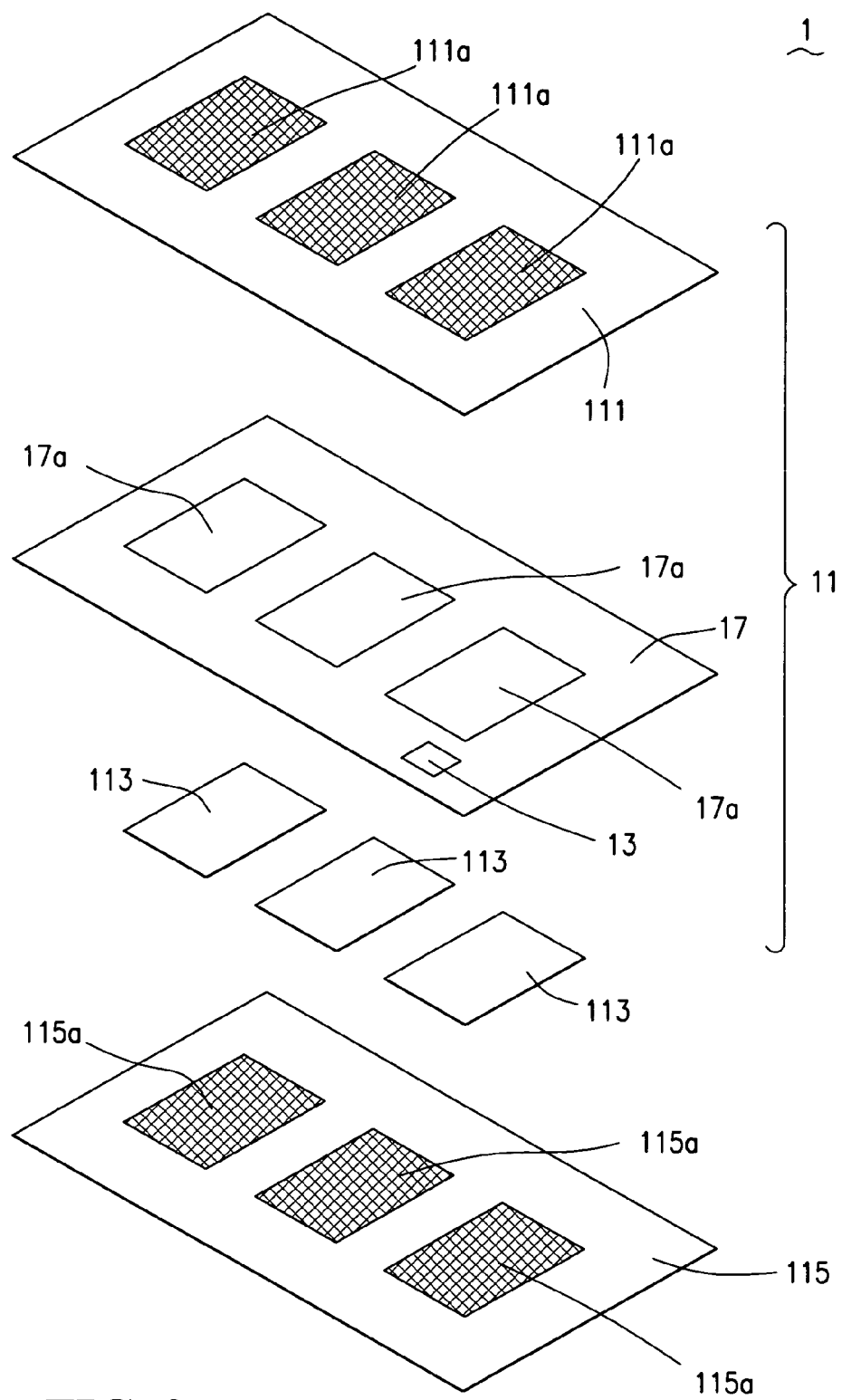
FIG. 3 is an exploded diagram showing a fuel cell device with a compound power supply according to another embodiment of the invention.

Referring to FIG. 3, an intermediate substrate 17 may be used for arrangement the auxiliary power supply 13. For instance, the auxiliary power supply 13 is soldered on the intermediate substrate 17 made of a printed circuit board, of which hollow regions 17a are aligned corresponding to the MEAs 113. The intermediate substrate 17 is then sandwiched in the fuel cell device 1 with a sealed power supply. The intermediate substrate 17 may be connected to the bottom surface of the cathode current collector 111 or to the top surface of the anode current collector 115.

Figure 4:
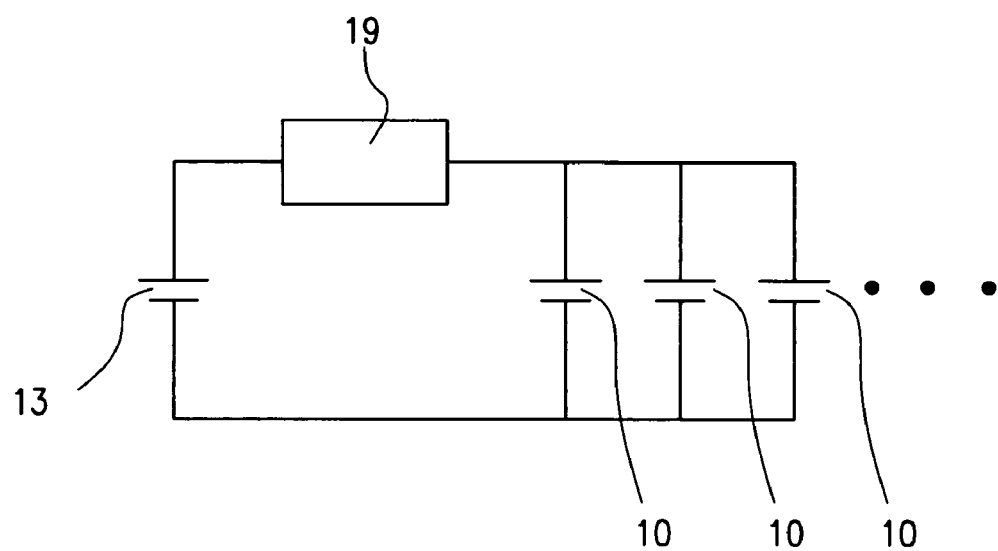
FIG. 4 illustrates the structure of fuel cell units connecting to an auxiliary power supply according to one embodiment of the invention.

FIG. 4 shows a structure of the fuel cell units connecting with the auxiliary power supply in one embodiment. The fuel cell units 10 are connected to the auxiliary power supply 13 through an electronic circuit 19 that may be a protective circuit, a voltage-regular circuit, a power-integrated circuit, and so forth.

The bipolar fuel cell board 11 further comprises a connecting interface 117 disposed on its side. The connecting interface 117 is used to transmit the power generated by the fuel cell units 10 and the auxiliary power supply 13.

The cathode current collector 111 and the anode current collector 115 may be made of printed circuit boards (PCB) like copper foil printed circuit substrates, and the cathode current collecting circuitries 111a and the anode current collecting circuitries 115a thereof are fabricated by PCB processes. Or, they may be made from copper-free printed circuit substrates, of which cathode current collecting circuitries 111a and anode current collecting circuitries 115a are manufactured by sputter, vapor deposition, press, carbon ink, etc. Additionally, the cathode current collecting circuitries 111a and the anode current collecting circuitries 115a may have through holes for fuel passing to the MEAs 113.

The sorts and numbers of the auxiliary power supply 13 described above are merely an exemplar, which are not intended to limit the invention. The auxiliary power supply 13 may be a super capacitor, micro primary fuel cell, or micro secondary fuel cell.

The aforementioned fuel cell device combines other compound power supplies, which benefit the quality of power and its stability.

The power of the auxiliary power supply 13 supports while the fuel cell units 10 of fuel cell device 1 are not optimized in their initial reactions. Therefore, the problem of insufficient output power is solved.

Various embodiments and changes may be made thereunto without departing from the broad spirit and scope of the invention. The above-described embodiment is intended to illustrate the present invention, not to limit the scope of the present invention.

What is claimed is:

1. A fuel cell device with a compound power supply comprising:
    a bipolar fuel cell board having an anode current collector, a cathode current collector and at least one membrane electrode assembly, wherein said membrane electrode assembly is sandwiched between said anode current collector and said cathode current collector, so as to form a plurality of fuel cell units;
    an auxiliary power supply disposed on one of the anode current collector and the cathode current collector, wherein said auxiliary power supply is connected to said fuel cell units; and
    a connecting interface disposed on a side of said bipolar fuel cell board for transmitting a power of the fuel cell units and/or power of the auxiliary power supply.

2. The fuel cell device of claim 1, wherein the auxiliary power supply is selected from a group consisting of a super capacitor, a primary cell, and a secondary cell.

3. The fuel cell device of claim 1, further comprising an electronic circuit connected to the fuel cell units and the auxiliary power supply, respectively.

4. The fuel cell device of claim 2, wherein the primary cell is a micro primary cell.

5. The fuel cell device of claim 2, wherein the secondary cell is a micro secondary cell.

* * * * *